US006294436B1

(12) United States Patent
Park et al.

(10) Patent No.: US 6,294,436 B1
(45) Date of Patent: *Sep. 25, 2001

(54) METHOD FOR FABRICATION OF ENLARGED STACKED CAPACITORS USING ISOTROPIC ETCHING

(75) Inventors: Youngjin Park, Poughkeepsie; Heon Lee, Fishkill, both of NY (US)

(73) Assignee: Infineon Technologies AG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/374,538

(22) Filed: Aug. 16, 1999

(51) Int. Cl.$^7$ ................................................ H01L 21/20
(52) U.S. Cl. ...................... 438/396; 438/253; 438/255; 438/622; 257/306; 257/309
(58) Field of Search ...................... 438/396, 253, 438/255, 398, 622; 257/329, 330, 393, 306, 309

(56) References Cited

U.S. PATENT DOCUMENTS

| | | |
|---|---|---|
| 4,855,953 | 8/1989 | Tsukamoto . |
| 4,896,197 | 1/1990 | Mashiko . |
| 5,236,860 | 8/1993 | Fazan . |
| 5,250,458 | 10/1993 | Tsukamoto . |
| 5,324,679 | 6/1994 | Kim . |
| 5,332,685 | 7/1994 | Park . |
| 5,443,993 * | 8/1995 | Park et al. ............................ 438/396 |
| 5,491,356 | 2/1996 | Dennison . |
| 5,497,017 | 3/1996 | Gonzales . |
| 5,623,243 * | 4/1997 | Watanabe et al. .................... 257/309 |
| 5,702,974 | 12/1997 | Kim . |
| 5,879,987 | 3/1999 | Wang . |
| 6,013,568 * | 8/2000 | Fujiwara ............................... 438/253 |
| 6,037,213 * | 3/2000 | Shih et al. ............................ 438/253 |
| 6,051,859 * | 4/2000 | Hosotani et al. ..................... 257/306 |
| 6,077,742 * | 6/2000 | Chen et al. ........................... 438/255 |
| 6,083,789 * | 7/2000 | Huang et al. ......................... 438/254 |
| 6,163,046 * | 12/2000 | Okumura et al. .................... 257/306 |
| 6,177,308 * | 1/2001 | Lou ...................................... 438/253 |
| 6,184,079 * | 2/2001 | Lee ...................................... 438/253 |

FOREIGN PATENT DOCUMENTS

| | | |
|---|---|---|
| 19904781 | 8/1999 | (DE) . |
| 000595078 | 8/1994 | (EP) . |
| 3-174767 | 3/1996 | (JP) . |

OTHER PUBLICATIONS

Japanese Journal of Applied and Physics, "Disk–Shaped Stacked Capacitor Cell for 256 MB Dynamic Random Access Memory", vol. 33, No. 8, pp. 4570–4575, Aug. 1994.*

Patents Abstracts of Japan, vol. 15, No. 419, abstract of 03–174767, Oct. 24, 1991.*

* cited by examiner

Primary Examiner—Matthew Smith
Assistant Examiner—Belur Keshavan
(74) Attorney, Agent, or Firm—Stanton C. Braden (57) ABSTRACT

In accordance with the present invention, a method for expanding holes for the formation of stacked capacitors is described and claimed. The method includes the steps of providing a planarized dielectric layer for forming bottom electrodes of the stacked capacitors, forming a first dielectric layer on the planarized dielectric layer, forming a second dielectric layer on the first dielectric layer. The second dielectric layer is selectively etchable relative to the first dielectric layer. The steps of etching the second dielectric layer to form holes for forming the bottom electrodes and isotropically etching the second dielectric layer to expand the holes for forming the bottom electrodes are also included.

20 Claims, 10 Drawing Sheets

METHOD FOR FABRICATION OF ENLARGED STACKED CAPACITORS USING ISOTROPIC ETCHING

BACKGROUND

1. Technical Field

This disclosure relates to semiconductor memory fabrication and more particularly, to a method for fabricating enlarged stacked capacitors by employing isotropic etching.

2. Description of the Related Art

Semiconductor memory cells include capacitors accessed by transistors to store data. Data is stored as a high or low bit depending on the state of the capacitor cell. The capacitor's charge or lack of charge indicates a high or low when accessed to read data, and the capacitor is charged or discharged to write data from the capacitor through a bit-line sense amplifier circuit.

Stacked capacitors are among the types of capacitors used in semiconductor memories, for example, dynamic random access memories (DRAM). Stacked capacitors are typically located on top of the cell transistor used to access a storage node of the capacitor as opposed to trench capacitors which are buried in the substrate of the device. Higher cell capacitance is beneficial for improving data sensing margin in DRAM devices.

In semiconductor memories, such as dynamic random access memories (DRAM) which include stacked capacitors, an area for a memory cell is proportional to the size of a stacked capacitor. For sub-$8F^2$ stacked capacitor DRAMs, i.e., DRAMs with memory cells occupying an area of less than $8F^2$ where F is a minium feature size of a given technology, the projected area of capacitor is drastically decreased. For example, only $1F^2$ of area for a $4F^2$ cell is available for the stacked capacitor and only $2F^2$ of area for a $6F^2$ cell is available for the stacked capacitor, while $3F^2$ of area is available for the stacked capacitor in a $8F^2$ cell. Thus, cell capacitance is also drastically decreased with the decrease minimum feature size (F) and also the decrease of cells in a layout.

Figure 1:
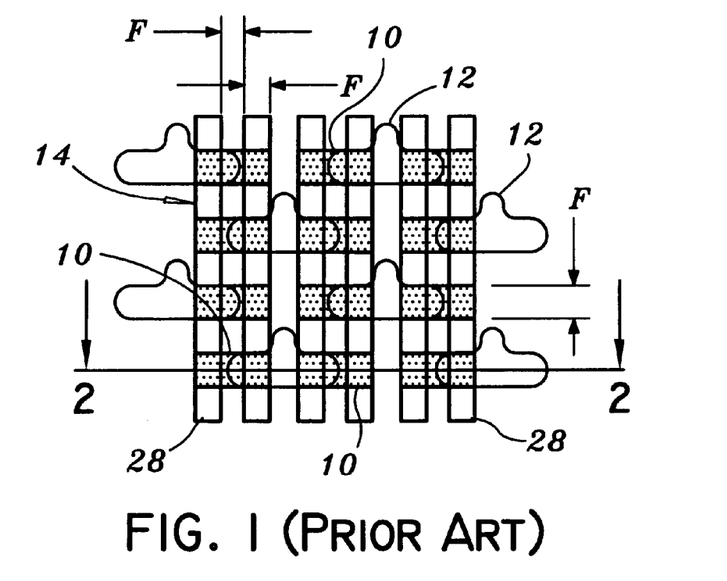
FIG. 1 is a conventional layout for $8F^2$ memory cells.

Referring to FIG. 1, a layout for $8F^2$ memory cells each having a stacked capacitor is shown. In the layout, stacked capacitors 10 are disposed in rows and columns. Active areas 12 are shown between pairs of stacked capacitors 10. Active areas 12 are surrounded by shallow trench isolation regions 14.

Figure 2:
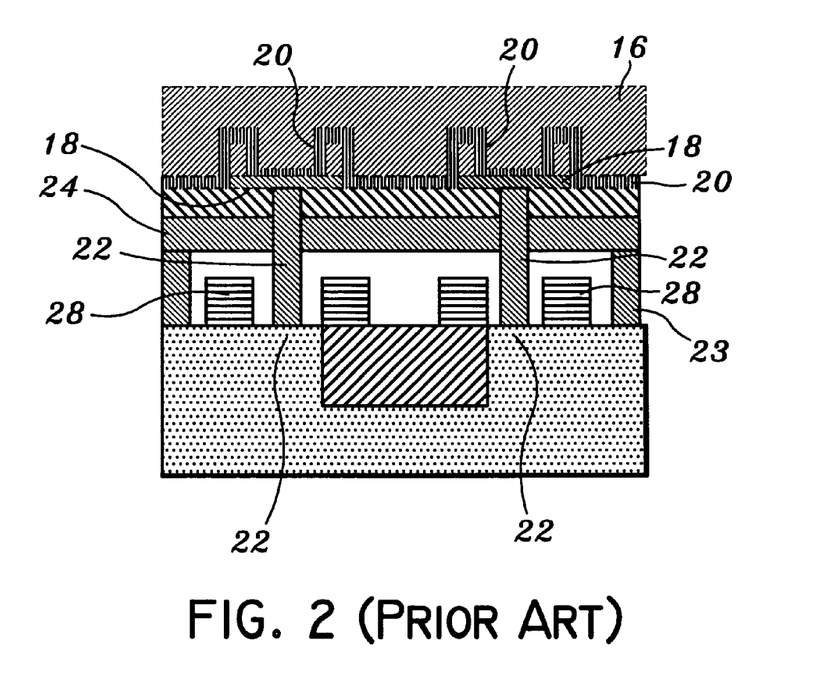
FIG. 2 is a cross-sectional view taken at section line 2—2 of FIG. 1 showing stacked capacitors in accordance with the prior art.

Referring to FIG. 2, a cross-sectional view is shown taken at section line 2—2 of FIG. 1. FIG. 2 illustratively depicts the major elements of the $8F^2$ memory cells. Stacked capacitors 10 are shown having a top electrode 16, a bottom electrode 18 and a capacitor dielectric layer 20 therebetween. Bottom electrode 18 is connected to a plug 22 which extends down to a portion of active area 12. Active areas 12 form an access transistor for charging and discharging stacked capacitor 10 in accordance with data on a bitline 24. Bitline 24 is coupled to a portion of active area 12 (source or drain of the access transistor) by a contact 23. When a gate conductor 28 is activated the access transistor conducts and charges or discharges stacked capacitor 10. When F is reduced with each new generation of DRAM design, stacked capacitor 12 loses area thereby reducing the capacitors capabilities. A typical capacitor area for an $8F^2$ memory cell is equal to about $3F^2$.

Figure 3:
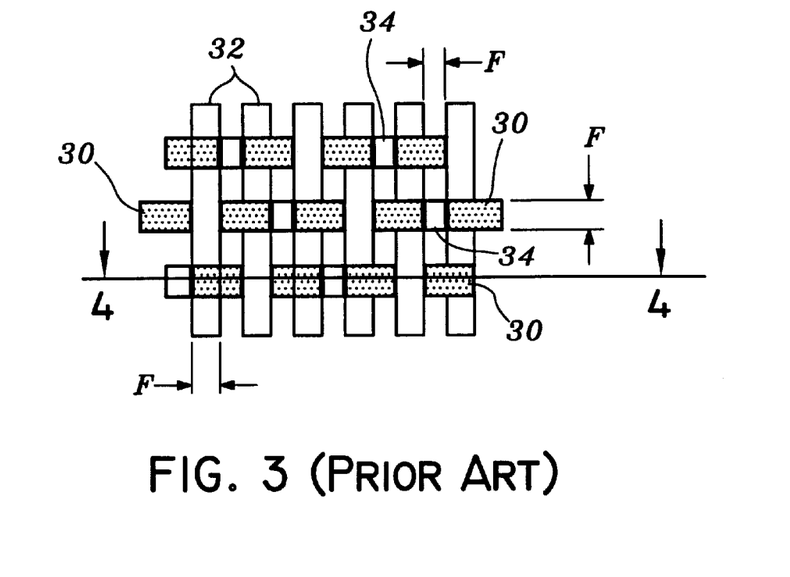
FIG. 3 is a conventional layout for $6F^2$ memory cells.

Referring to FIG. 3, a layout for $6F^2$ memory cells each having a stacked capacitor is shown. In the layout, stacked capacitors 30 are disposed in rows and columns. Active areas 32 are shown between pairs of stacked capacitors 30, similar to FIG. 1. Active areas 32 are surrounded by narrower shallow trench isolation regions 34.

Figure 4:
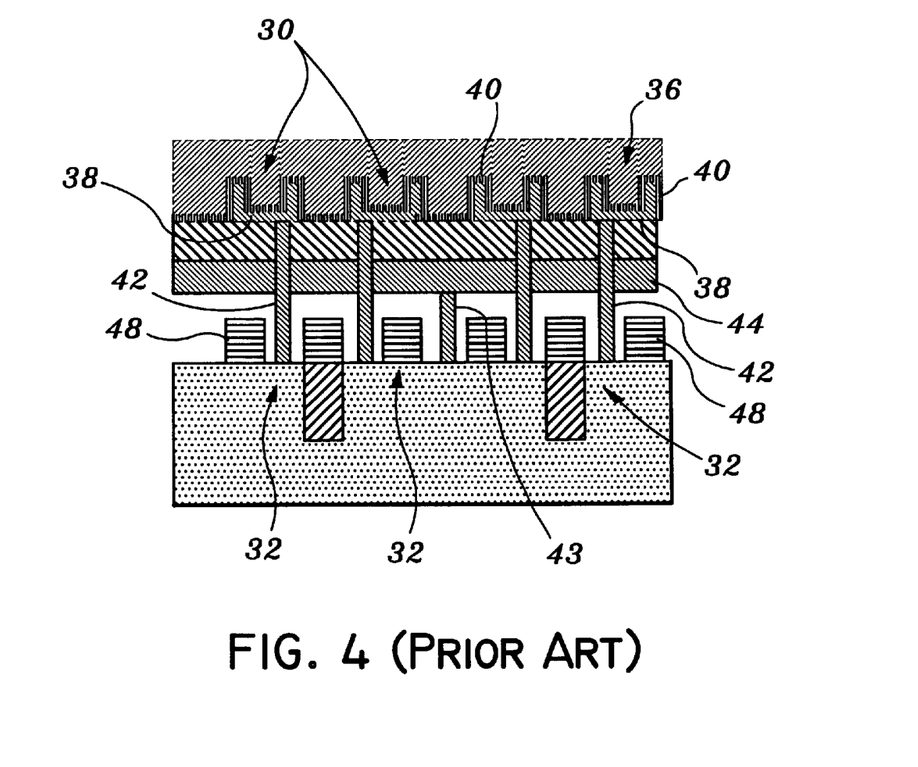
FIG. 4 is a cross-sectional view taken at section line 4—4 of FIG. 3 showing stacked capacitors in accordance with the prior art.

Referring to FIG. 4, a cross-sectional view is shown taken at section line 4—4 of FIG. 3. FIG. 4 illustratively depicts the major elements of the $6F^2$ memory cells. Stacked capacitors 30 are shown having a top electrode 36, a bottom electrode 38 and a capacitor dielectric layer 40 therebetween. Bottom electrode 38 is connected to a plug 42 which extends down to a portion of active area 32. Active areas 32 form an access transistor for charging and discharging stacked capacitor 30 in accordance with data on a bitline 44. Bitline 44 is coupled to a portion of active area 32 (source or drain of the access transistor) by a contact 43. When a gate conductor 48 is activated the access transistor conducts and charges or discharges stacked capacitor 30. Stacked capacitors 30 are smaller than those of the $8F^2$ memory cells. When F is reduced with each new generation of DRAM design, stacked capacitor 30 losses area thereby reducing the capacitors capabilities. A typical capacitor area for a $6F^2$ memory cell is equal to about $2F^2$.

Therefore, a need exists for a method for increasing or maintaining stacked capacitor area while reducing the size of memory cells.

SUMMARY OF THE INVENTION

In accordance with the present invention, a method for expanding holes for the formation of stacked capacitors includes the steps of providing a planarized dielectric layer for forming bottom electrodes of the stacked capacitors, forming a first dielectric layer on the planarized dielectric layer, forming a second dielectric layer on the first dielectric layer, the second dielectric layer being selectively etchable relative to the first dielectric layer, etching the second dielectric layer to form holes for forming the bottom electrodes and isotropically etching the second dielectric layer to expand the holes for forming the bottom electrodes.

A method for forming stacked capacitors for a semiconductor memory device, in accordance with the present invention, includes the steps of providing a substrate having a planarized dielectric layer formed on access transistors, the planarized dielectric layer having conductive plugs disposed therein for connecting to the access transistors, forming a first dielectric layer on a top surface of the planarized dielectric layer, forming a second dielectric layer which is selectively etchable relative to the first dielectric layer, patterning holes in the second dielectric layer by selectively etching the second dielectric layer relative to the first dielectric layer and isotropically etching the holes in the second dielectric layer to expand the holes to provide an increased surface area within the holes over a surface area formed by the selectively etching the second dielectric layer.

Another method for forming stacked capacitors for a dynamic random access memory device includes the steps of providing a substrate having a planarized glass layer formed on access transistors, the planarized glass layer having conductive plugs disposed therein for connecting to the access transistors, forming a nitride layer on a top surface of the planarized glass layer, forming an oxide layer which is selectively etchable relative to the nitride layer, depositing a resist layer on the oxide layer, patterning the resist layer by forming openings in the resist over locations for the conductive plugs, anisotropically etching holes in the oxide layer by selectively etching the oxide layer relative to the nitride layer, isotropically etching the holes in the oxide layer to expand the holes to provide an increased surface area within the holes over a surface area formed by the selectively etching the oxide layer, removing the resist layer, removing portions of the nitride layer in the holes to expose the conductive plugs, depositing a conductive layer in the holes to form a bottom electrode for the stacked capacitors, and depositing a capacitor dielectric layer on the conductive layer.

In alternate methods, the first dielectric layer may include a nitride (or aluminum oxide) and the second dielectric layer may include an oxide. The steps of removing portions of the first dielectric layer in the holes, depositing a conductive layer in the holes to form the bottom electrode and depositing a capacitor dielectric layer on the conductive layer are preferably included. The step of isotropically etching may include employing wet etching or chemical dry etching. The wet etch process may employ HF, diluted HF or BHF. The chemical dry etching may include $CF_4$—$O_2$, $C_2F_6$, $CH_4$—$I_2$ ($Br_2$, $Cl_2$), $CH_4$—$Br_2(Cl_2)$, $CBrF_3$, $CF_3Cl$, $CF_2Cl_2$, HCl or $NF_3$—He. Other etchants are also contemplated for both wet and dry etching. The step of isotropically etching may include the step of expanding the holes such that a surface area of the holes is increased by a factor greater than 1. The step of isotropically etching may include the step of expanding the holes such that lateral sidewalls of the second dielectric layer adjacent to the holes are recessed by a distance of at least about one third a minimum feature size for a given technology. The holes are preferably tapered. The step of isotropically etching may include the step of forming a stepped portion in the holes. A stacked capacitor formed in accordance with these methods is also included.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DESCRIPTION OF PREFERRED EMBODIMENTS

The present invention relates to semiconductor memory fabrication and more particularly, to a method for fabricating enlarged stacked capacitors by employing isotropic etching. The present invention includes methods for increasing capacitor area, while satisfying other design rules for fabricating a semiconductor memory device. A projected area of a stacked capacitor is enlarged by employing an additional isotropic etch. In this way electrodes are formed in larger openings forming stacked capacitors with increased area. In one embodiment, the stacked capacitor has an area about 2 times greater than the prior art stacked capacitors in $4F^2$ cells employing the present invention.

Figure 5:
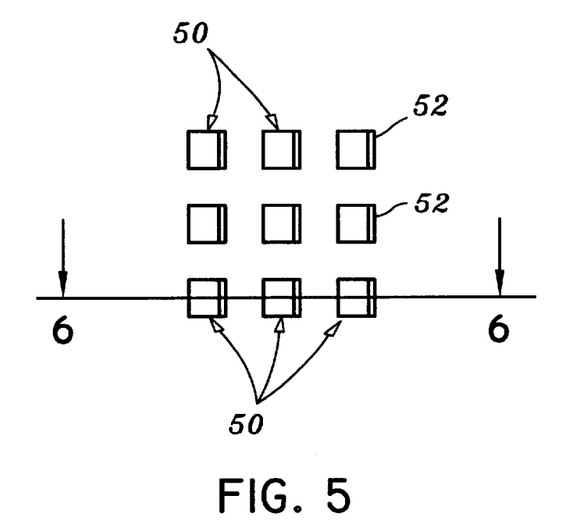
FIG. 5 is a layout for $4F^2$ memory cells.
Figure 6:
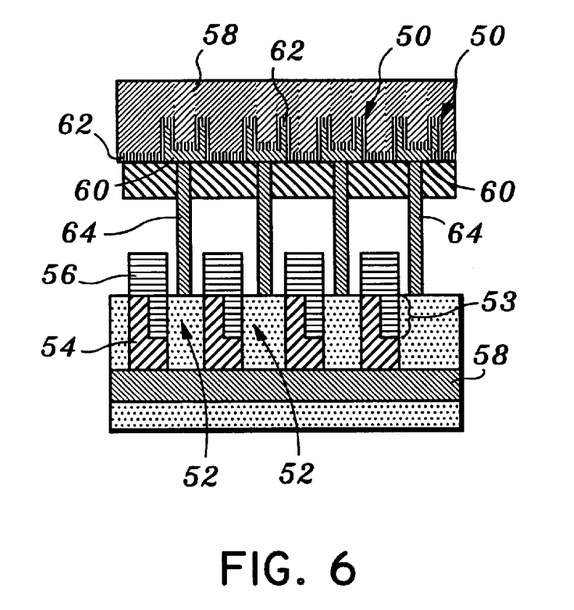
FIG. 6 is a cross-sectional view taken at section line 6—6 of FIG. 5 showing stacked capacitors.

Referring now in specific detail to the drawings in which like reference numerals identify similar or identical elements throughout the several views, and initially to FIG. 5, a layout for $4F^2$ memory cells each having a stack capacitor is shown. In the layout, stacked capacitors 50 are disposed in rows and columns. Active areas 52 are vertically disposed to provide vertical access transistors 53 (FIG. 6). The layout shown is described in detail in a commonly assigned U.S. Application 09/374,537 entitled "METHOD FOR FABRICATING $4F^2$ MEMORY CELLS WITH IMPROVED GATE CONDUCTOR", filed concurrently herewith and incorporated herein by reference.

Referring to FIG. 6, a cross-sectional view is shown taken at section line 6—6 of FIG. 5. FIG. 6 illustratively depicts the major elements of the $4F^2$ memory cells. Stacked capacitors 50 are shown having a top electrode 58, a bottom electrode 60 and a capacitor dielectric layer 62 therebetween. Bottom electrode 60 is connected to a plug 64 which extends down to a portion of active area 52. Active areas 52 form vertical access transistors 53 for charging and discharging stacked capacitor 50 in accordance with data on a buried bitline 58. Shallow trench isolation regions 54 isolate gate conductors 56 from buried bitline 58. When gate conductors 56 are activated vertical access transistor 53 conducts and charges or discharges stacked capacitor 50. Stacked capacitors 50 are smaller than those of the $6F^2$ memory cells. When F is reduced with each new generation of DRAM design, stacked capacitor 50 loses area thereby reducing the capacitors capabilities. A capacitor area for a $4F^2$ memory cell is equal to about $1F^2$.

Figure 7:
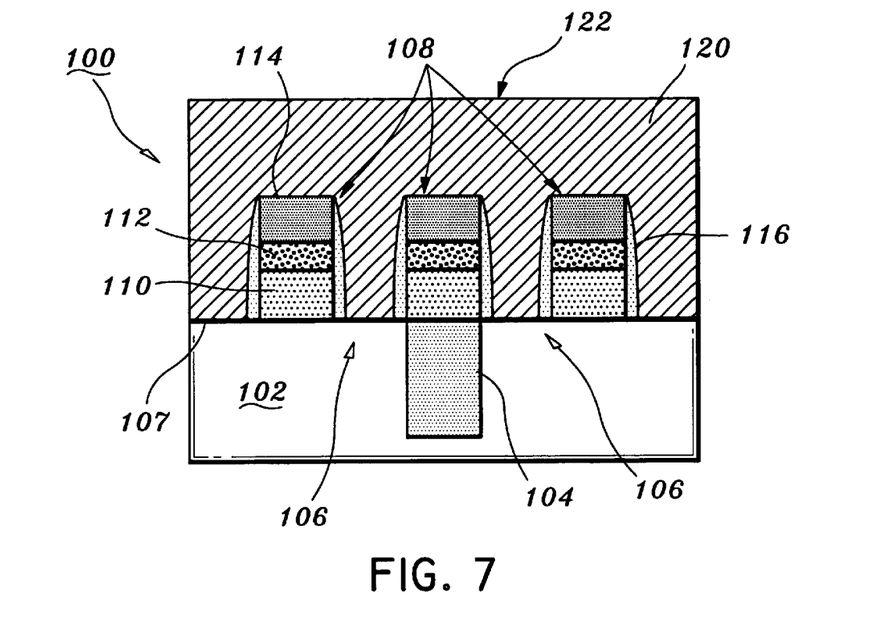
FIG. 7 is a cross-sectional view of a memory device having $6F^2$ memory cells and showing a planarized glass layer for employing the present invention.

Referring to FIG. 7, the present invention will now be described for a semiconductor memory having $6F^2$ memory cells. The following description is applicable to $8F^2$ cells and other cell areas having similar structure. A semiconductor memory device 100, such as a dynamic random access memory, includes a substrate 102. Substrate 102 is preferably a monocrystalline silicon substrate. Other materials may be used as well, for example gallium arsenide, silicon on insulator, etc. Shallow trench isolation regions 104 are formed in substrate 102. Substrate 102 also includes doped regions or active areas 106 for forming an access transistor. A gate oxide layer 107 is formed over the surface of substrate 102.

Polysilicon or other conductive layers are deposited on substrate 102 for forming gate structures 108. Gate structures 108 preferably include a polysilicon layer 110 and a metal layer 112. Metal layer 112 may include tungsten, molybdenum, or their silicides. A cap 114 (nitride or oxide) and spacers 116 (nitride or oxide) are formed over polysilicon layer 110 and metal layer 112. A dielectric layer 120 is deposited over gate structures 108 to fill in gaps and planarized to prepare a top surface 122. Dielectric layer 120 preferably conforms to gate structures 108. In a preferred embodiment, dielectric layer 120 includes a glass, such as borophospho-silicate glass (BPSG) or high density plasma (HDP) oxide.

Figure 8:
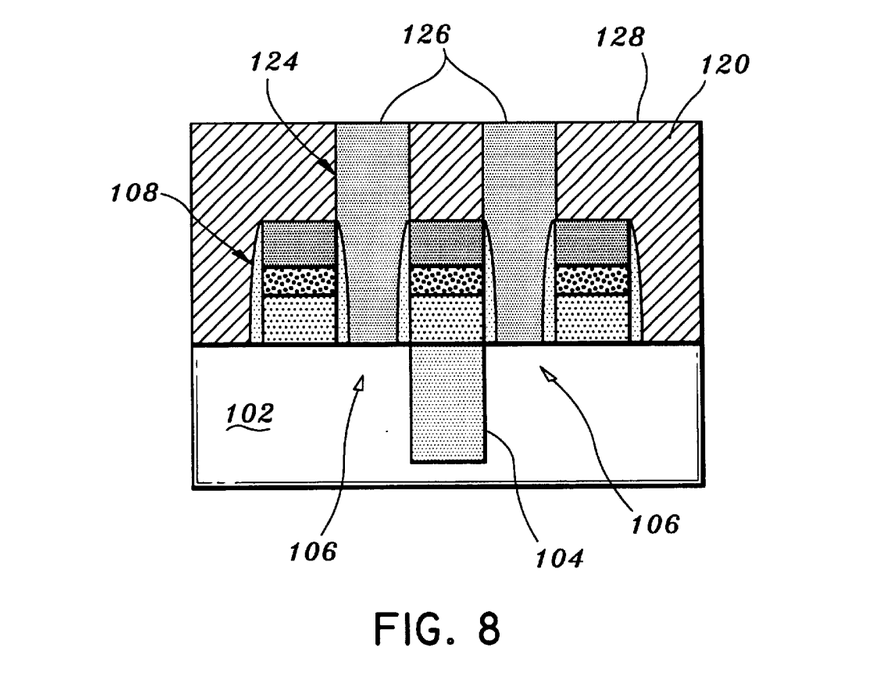
FIG. 8 is a cross-sectional view of the memory device of FIG. 7 showing conductive plugs formed for use with the present invention.

Referring to FIG. 8, dielectric layer 120 is etched to form contact holes 124 down to active areas 106 in substrate 102. A conductive material is deposited in contact holes 124 to form plugs 126. Conductive material preferably includes polysilicon. A top surface 128 of dielectric layer 120 is planarized to remove remaining conductive material and to smooth the surface.

Figure 9:
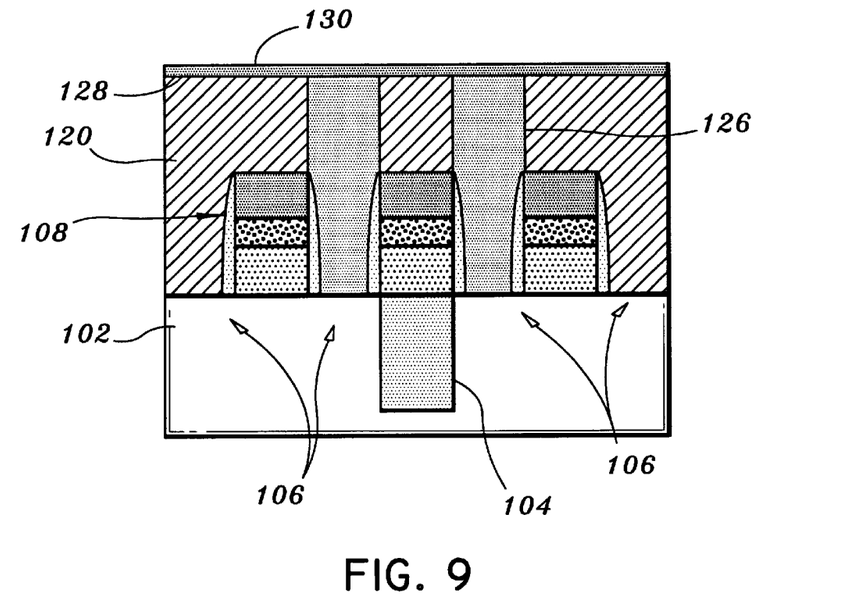
FIG. 9 is a cross-sectional view of the memory device of FIG. 8 showing a first dielectric layer formed on a top surface of the glass layer for employing the present invention.

Referring to FIG. 9, a dielectric layer 130 is deposited on top surface 128. Dielectric layer 130 preferably includes a nitride, such as silicon nitride. Dielectric layer 130 may include an oxide, such as silicon oxide, Aluminum oxide or silicon oxy-nitride. Dielectric layer 130 is deposited in accordance with the present invention to protect capacitor contacts during an isotropic etching which will be described in greater detail below. Dielectric layer 130 may be between about 50 A to about 200 A although other thicknesses may be employed.

Figure 10:
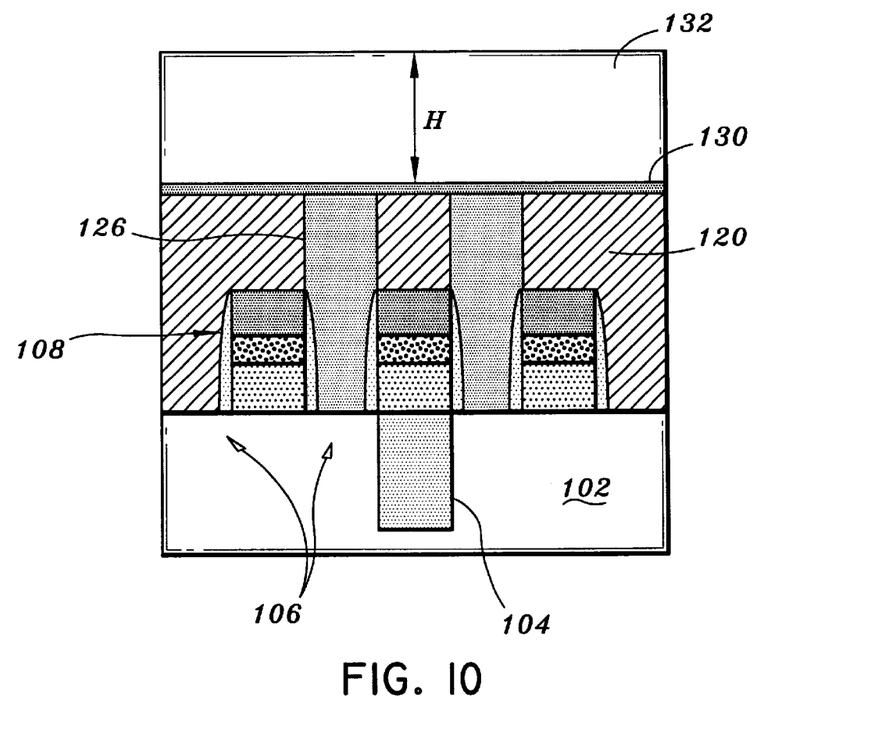
FIG. 10 is a cross-sectional view of the memory device of FIG. 9 showing a second dielectric layer formed on the first dielectric layer for employing the present invention.

Referring to FIG. 10, a dielectric layer 132 is deposited on dielectric layer 130. Dielectric layer 132 is selectably etchable relative to dielectric layer 130. In a preferred embodiment, an oxide, such as silicon oxide is used to form dielectric layer 132. Then, dielectric layer 130 is preferably a nitride (or Aluminum oxide). However, if a nitride is used for dielectric layer 132, an oxide layer should be used for dielectric layer 130. Dielectric layer 132 is deposited with a thickness H. H is preferably between about 1F to about 4F. Other thicknesses may be employed.

Figure 11:
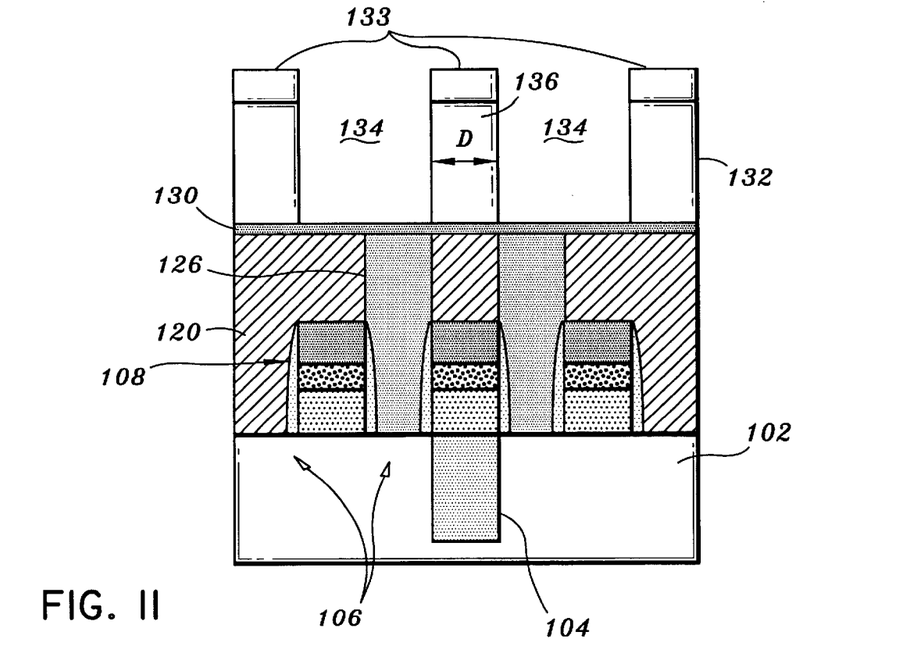
FIG. 11 is a cross-sectional view of the memory device of FIG. 10 showing the second dielectric layer having capacitor holes formed therein for employing the present invention.

Referring to FIG. 11, dielectric layer 132 is patterned to form capacitor bottom electrode holes 134. A resist layer 133 is formed on dielectric layer 132, and patterned to expose portions of dielectric layer 132 to be removed. Etching holes 134 is preferably performed by an anisotropic etch process such as reactive ion etching (RIE). In a preferred embodiment, the distance D between plugs 126 is preferably about one minimum feature size, F, although other distance may be formed, and dielectric layer 132 includes a portion 136 occupying this distance.

Figure 12:
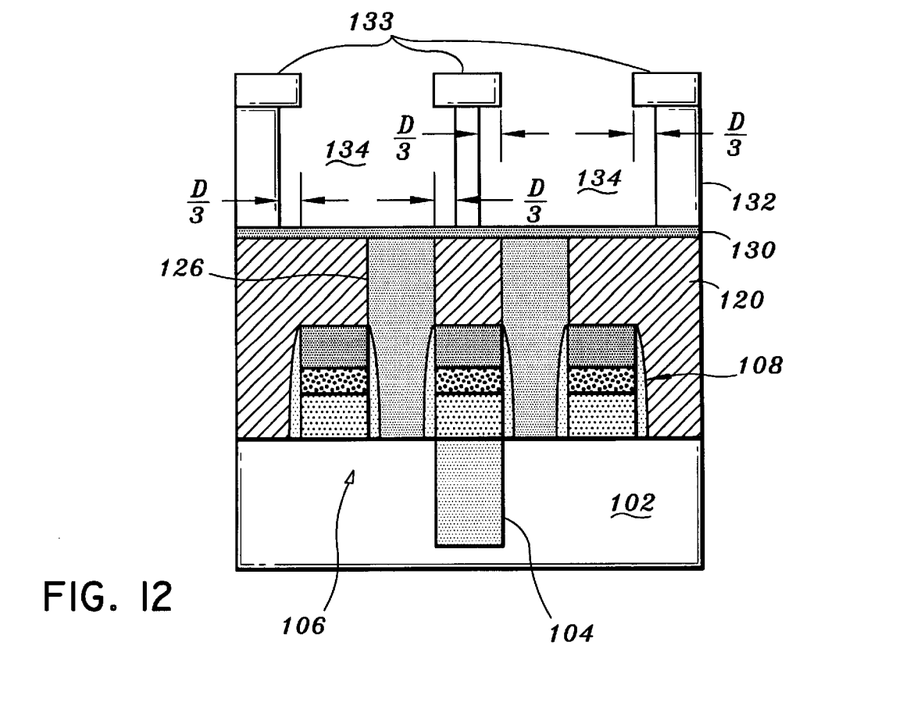
FIG. 12 is a cross-sectional view of the memory device of FIG. 11 showing the second dielectric layer isotropically etched in accordance with the present invention.

Referring to FIG. 12, an isotropic etch is performed to enlarge holes 134. This is performed while resist 133 is present to protect a top surface of dielectric layer 132 from the isotropic etch process. The isotropic etch step is included to enlarge a capacitor area by enlarging holes 134. Since the space between two adjacent capacitors is D, a distance of about D/3 is recessed back on each side of portions 136. This amount of material may be removed without causing any interference. More or less of portion 136 may be removed depending on design requirements. The isotropic etch process may include a wet or dry etch. The wet etch process may employ HF, diluted HF or BHF. The chemical dry etching may include $CF_4$—$O_2$, $C_2F_6$, $CH_4$—$I_2$ ($Br_2$, $Cl_2$), $CH_4$—$Br_2(Cl_2)$, $CBrF_3$, $CF_3Cl$, $CF_2Cl_2$, HCl or $NF_3$—He.

Figure 13:
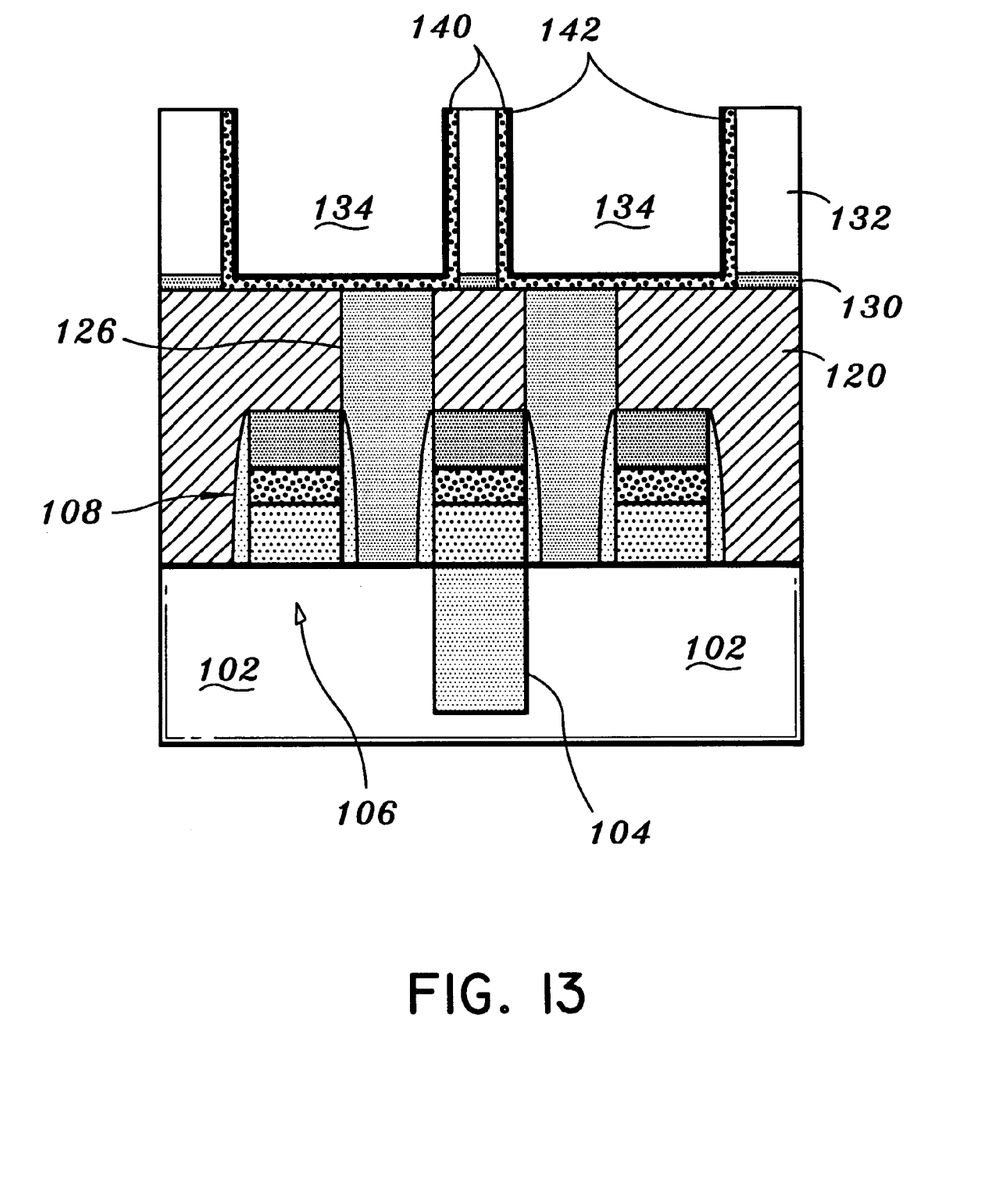
FIG. 13 is a cross-sectional view of the memory device of FIG. 12 showing a bottom electrode layer and a capacitor dielectric layer deposited in accordance with the present invention.

Referring to FIG. 13, dielectric layer 130 is now etched selective to dielectric layer 132 and using dielectric layer 132 as an etch mask. Bottom electrodes 140 are formed by depositing a conductive material, such as platinum, to line the sides and bottom of enlarged holes 134. A chemical mechanical polish is performed to remove material form the top surface and to isolate bottom electrodes 140 from each other. A capacitor dielectric layer 142 is formed on bottom electrodes 140. A top electrode (not shown) will be formed in later steps. Processing continues from this point as is known in the art.

Figure 14:
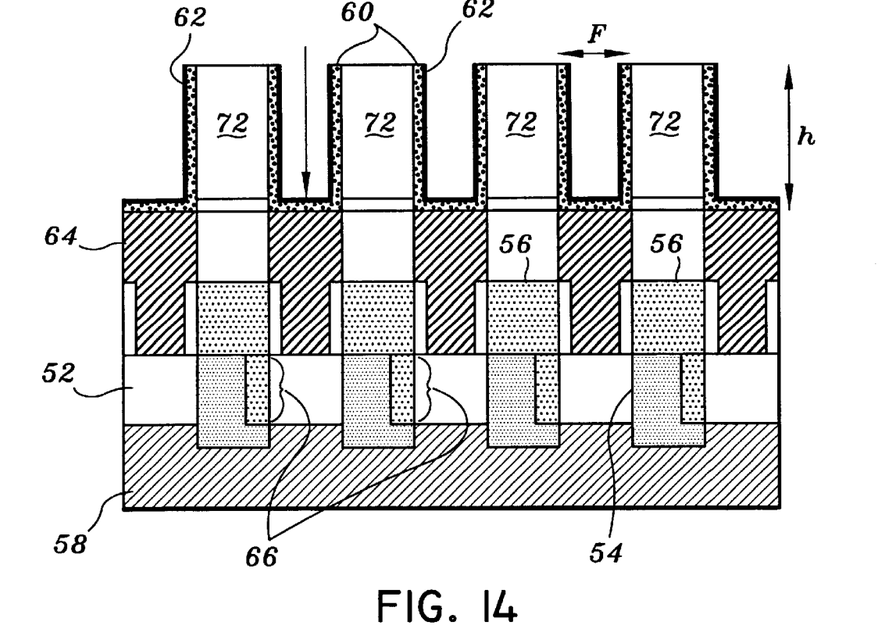
FIG. 14 is a cross-sectional view of a $4F^2$ memory cell device showing a bottom electrode layer and a capacitor dielectric layer deposited on which the present invention may be employed.

Referring to FIG. 14, a cross-section of a stacked capacitor structure implemented with $4F^2$ memory cells is shown. The layout shown is described in detail in the commonly assigned U.S. Application 09/374,537, previously incorporated herein by reference. Stacked capacitor structures are shown having a bottom electrode 60 and a capacitor dielectric layer 62 formed. Bottom electrode 60 is connected to a plug 64 which extends down to a portion of active area 52. Active areas 52 form vertical access transistors 66 for charging and discharging the stacked capacitor in accordance with data on a buried bitline 58. Shallow trench isolation regions 54 isolate gate conductors 56 from buried bitline 58. When gate conductors 56 are activated vertical access transistor 66 conducts and charges or discharges the stacked capacitor. An oxide layer includes portions 72 between adjacent bottom electrodes 60. This distance is typically about F, the minimum feature size. An approximated calculation for capacitor area may be computed by determining the surface area of the bottom electrode 60. If the distance described for bottom electrode 60 is indeed F and a height h of the bottom electrode is given, the capacitor area may be calculated as follows:

$$\text{Capacitor Area} = F^2 + 4 \cdot F \cdot h$$

If F is 0.15 microns and h is 0.4 microns than the capacitance area is about 0.2625 square microns.

Figure 15:
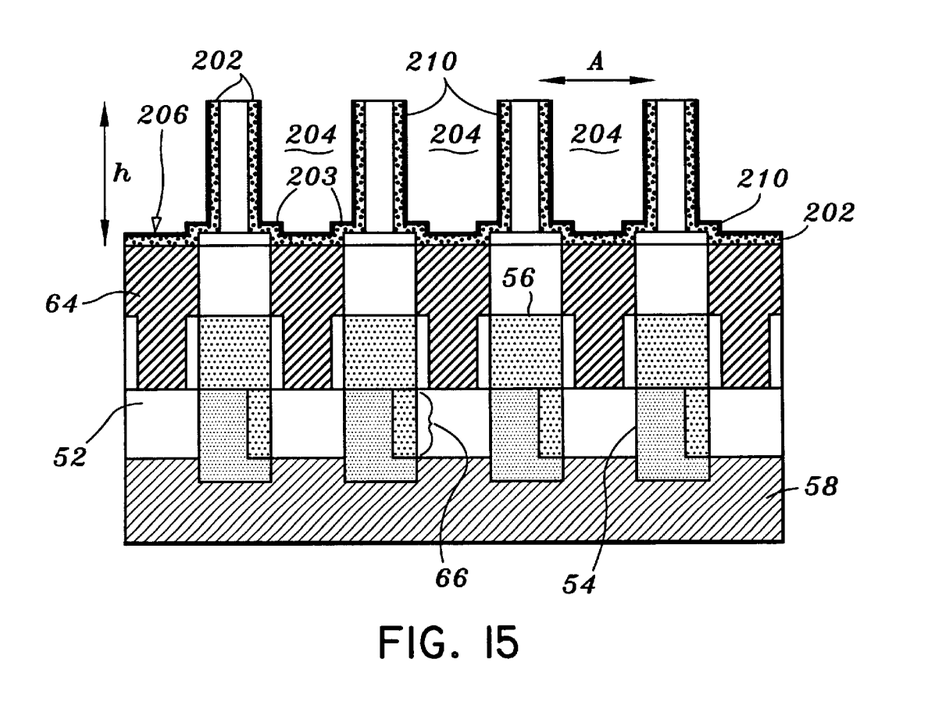
FIG. 15 is a cross-sectional view of a $4F^2$ memory cell device showing a bottom electrode layer and a capacitor dielectric layer deposited in accordance with the present invention.

Referring to FIG. 15, bottom electrodes 202 are shown in accordance with the present invention. Holes 204 for supporting bottom electrodes 202 have been isotropically etched in accordance with the present invention. Bottom electrodes 202 are deposited in holes 204. A stepped portion 203 is advantageously formed which increases capacitance area further. A dielectric layer 210 is formed over bottom electrodes 202.

The distance between bottom electrodes 202 has been decreased making a bottom portion 206 increased in area. In one illustrative embodiment, dimension "A" is about 5/3 F. Other increased dimensions are also contemplated. Using the 5/3 F dimension and h for the capacitor height, a calculation of capacitor area may be performed as before.

$$\text{Capacitor Area} = (25/9)F^2 + 4(5/3 \cdot F) \cdot$$

If F is 0.15 microns and h is 0.4 microns than the capacitance area is about 0.4625 square microns. This represents an increase in capacitor area of about 1.8 times. For $4F^2$ memory cells, capacitor areas of about 2.8 $F^2$ can be achieved. For $6F^2$ memory cells, capacitor areas of about 4.4 $F^2$ can be achieved. For $8F^2$ memory cells, capacitor areas of about 6.1 $F^2$ can be achieved. These are significant improvements for capacitor areas which were about, 1 $F^2$, 2 $F^2$ and 3 $F^2$, respectively.

Figure 16:
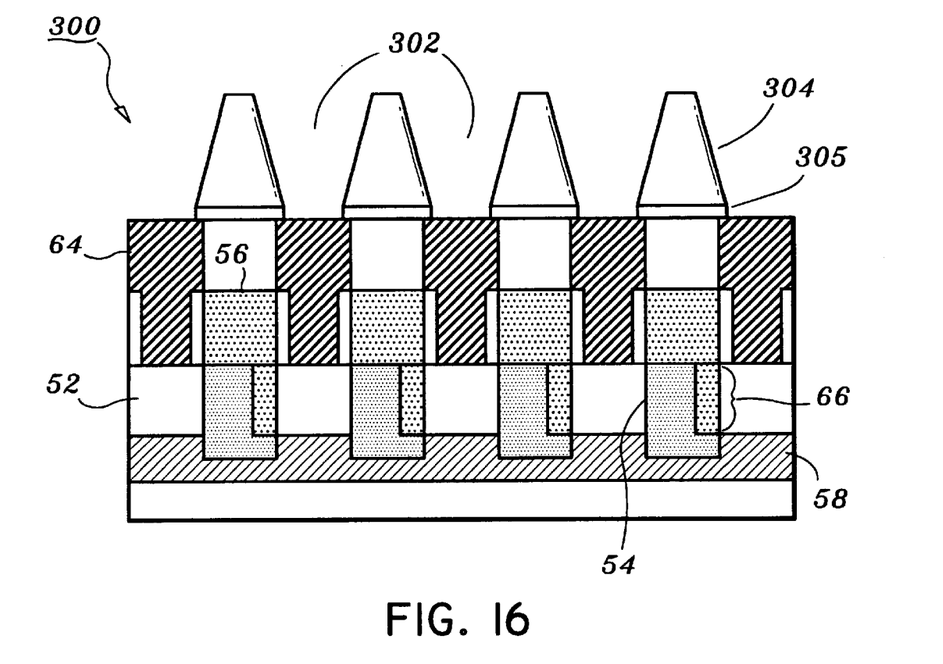
FIG. 16 is a cross-sectional view of a memory device showing a dielectric layer having tapered capacitor holes formed therein for employing the present invention.

Referring to FIG. 16, an alternate method for forming stacked capacitor structure using isotropic etching in accordance with the present invention is shown. The method is illustratively shown for $4F^2$ memory cells, however, this method is applicable to other types of memory cells. Since depositing bottom electrode materials is strongly dependent on the geometrical shape of the surface to be deposited on, a tapered trench structure 300 is preferable. Tapered holes 302 are etched into dielectric layers 304 and 305 which is preferably, an oxide. Tapered holes 302 are etched by an anisotropic process such as a dry etch process.

Figure 17:
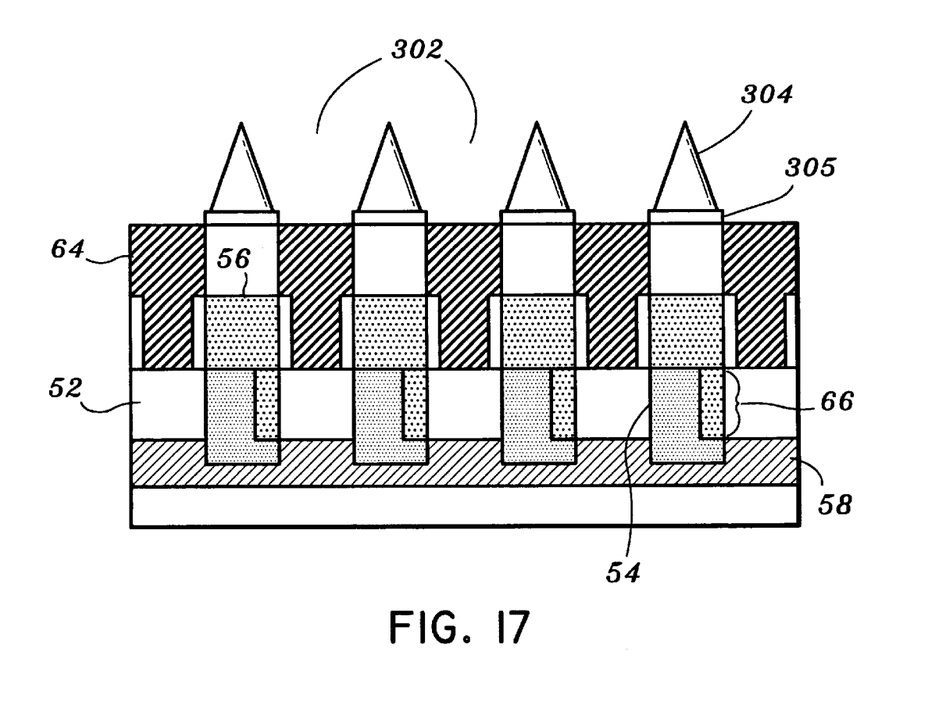
FIG. 17 is a cross-sectional view of the memory device of FIG. 16 showing the dielectric layer isotropically etched in accordance with the present invention.

Referring to FIG. 17, after etching tapered holes 302, isotropic etching is performed in accordance with the invention. The isotropic etching includes the same processes as described above. The isotropic etch enlarges the area for the capacitor electrodes which will be formed in later steps.

Figure 18:
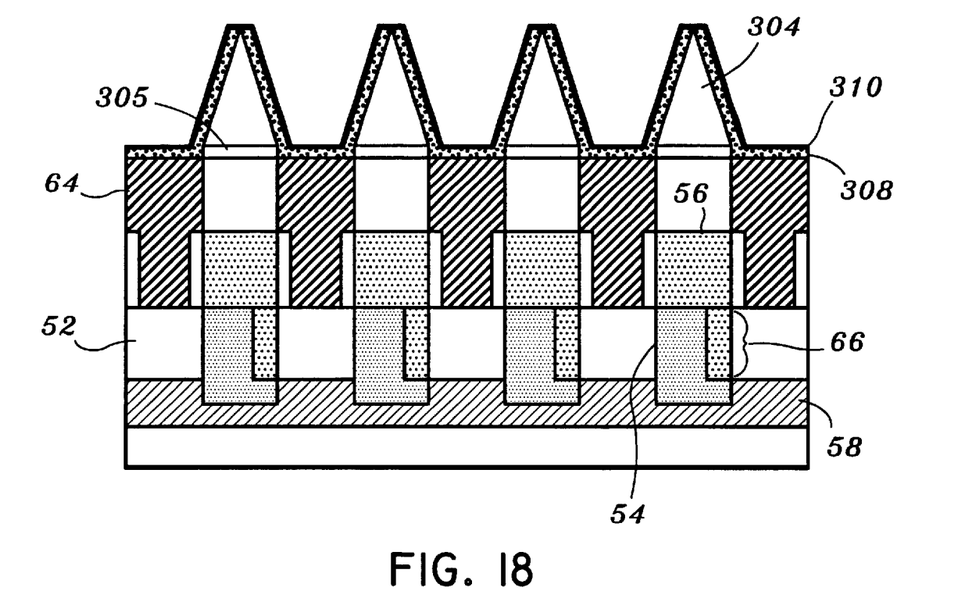
FIG. 18 is a cross-sectional view of the memory device of FIG. 17 showing a bottom electrode layer and a capacitor dielectric layer deposited in accordance with the present invention.
Figure 19:
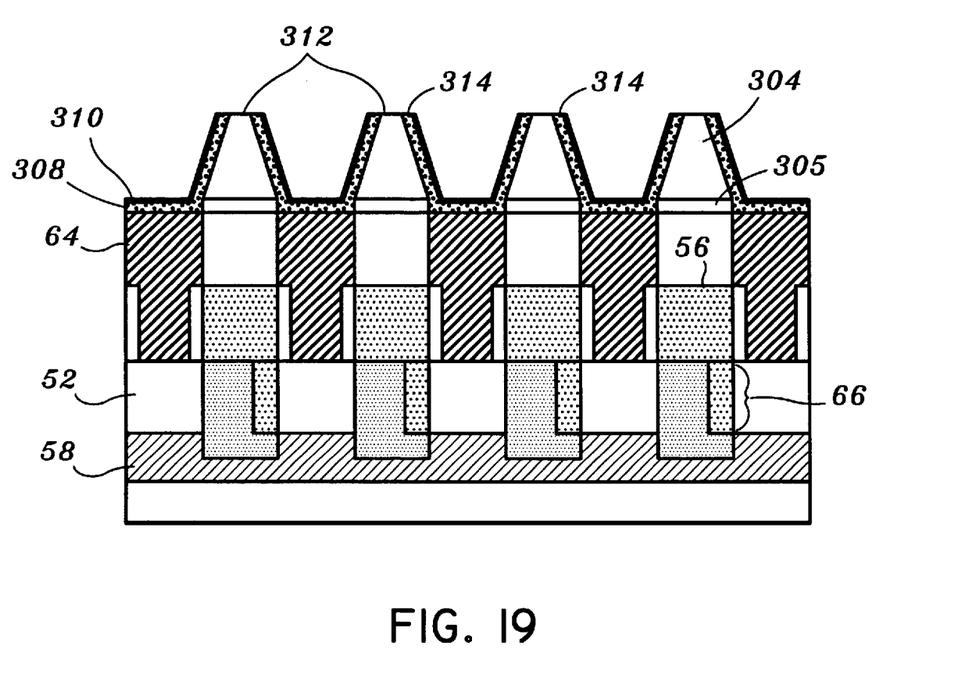
FIG. 19 is a cross-sectional view of the memory device of FIG. 18 showing the memory device after a chemical mechanical polish process to isolate the bottom electrodes in accordance with the present invention.

Referring to FIGS. 18 and 19, a conductive layer 308 is deposited in tapered holes 302 on layer 304. As shown in FIG. 18, tips 312 are polished to isolate bottom electrodes 314. A chemical mechanical polish (CMP) may be employed to perform this. This is followed by a capacitor dielectric layer 310 deposition. Processing continues from this point as is known in the art.

Having described preferred embodiments for methods for fabrication of enlarged stacked capacitors using isotropic etching (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for expanding holes for the formation of stacked capacitors comprising the steps of:
   providing a planarized dielectric layer for forming bottom electrodes of the stacked capacitors;
   forming a first dielectric layer on the planarized dielectric layer;
   forming a second dielectric layer on the first dielectric layer, the second dielectric layer being selectively etchable relative to the first dielectric layer;
   etching the second dielectric layer to form holes for forming the bottom electrodes; and
   isotropically etching the second dielectric layer to expand the holes for forming the bottom electrodes.

2. The method as recited in claim 1, wherein the first dielectric layer includes one of a nitride and Aluminum oxide and the second dielectric layer includes an oxide.

3. The method as recited in claim 1, further comprising the steps of:
   removing portions of the first dielectric layer in the holes;
   depositing a conductive layer in the holes to form the bottom electrode; and
   depositing a capacitor dielectric layer on the conductive layer.

4. The method as recited in claim 1, wherein the step of isotropically etching includes employing one of a wet etch and a chemical dry etch process.

5. The method as recited in claim 1, wherein the step of isotropically etching includes the step of expanding the holes such that a surface area of the holes is increased by a factor greater than 1.

6. The method as recited in claim 1, wherein the step of isotropically etching includes the step of expanding the holes such that lateral sidewalls of the second dielectric layer adjacent to the holes are recessed by a distance of at least about one third a minimum feature size for a given technology.

7. The method as recited in claim 1, wherein the holes are tapered.

8. The method as recited in claim 1, wherein the step of isotropically etching includes the step of forming a stepped portion in the holes.

9. A method for forming stacked capacitors for a semiconductor memory device comprising the steps of:
   providing a substrate having a planarized dielectric layer formed on access transistors, the planarized dielectric layer having conductive plugs disposed therein for connecting to the access transistors;
   forming a first dielectric layer on a top surface of the planarized dielectric layer;
   forming a second dielectric layer which is selectively etchable relative to the first dielectric layer;
   patterning holes in the second dielectric layer by selectively etching the second dielectric layer relative to the first dielectric layer; and
   isotropically etching the holes in the second dielectric layer to expand the holes to provide an increased surface area within the holes over a surface area formed by the selectively etching the second dielectric layer.

10. The method as recited in claim 9, wherein the first dielectric layer includes one of a nitride and Aluminum oxide and the second dielectric layer includes an oxide.

11. The method as recited in claim 9, further comprising the steps of:
   removing portions of the first dielectric layer in the holes to expose the conductive plugs;
   depositing a conductive layer in the holes to form a bottom electrode for the stacked capacitors; and
   depositing a capacitor dielectric layer on the conductive layer.

12. The method as recited in claim 9, wherein the step of isotropically etching includes employing one of a wet etch and a chemical dry etch process.

13. The method as recited in claim 9, wherein the step of isotropically etching includes the step of expanding the holes such that lateral sidewalls of the second dielectric layer adjacent to the holes are recessed by a distance of at least about one third a minimum feature size for a given technology.

14. The method as recited in claim 9, wherein the holes are tapered.

15. The method as recited in claim 9, wherein the step of isotropically etching includes the step of forming a stepped portion in the holes.

16. A method for forming stacked capacitors for a dynamic random access memory device comprising the steps of:

providing a substrate having a planarized glass layer formed on access transistors, the planarized glass layer having conductive plugs disposed therein for connecting to the access transistors;

forming a nitride layer on a top surface of the planarized glass layer;

forming an oxide layer which is selectively etchable relative to the nitride layer;

depositing a resist layer on the oxide layer;

patterning the resist layer by forming openings in the resist over locations for the conductive plugs;

anisotropically etching holes in the oxide layer by selectively etching the oxide layer relative to the nitride layer;

isotropically etching the holes in the oxide layer to expand the holes to provide an increased surface area within the holes over a surface area formed by the selectively etching the oxide layer;

removing the resist layer;

removing portions of the nitride layer in the holes to expose the conductive plugs;

depositing a conductive layer in the holes to form a bottom electrode for the stacked capacitors; and depositing a capacitor dielectric layer on the conductive layer.

17. The method as recited in claim 16, wherein the step of isotropically etching includes employing one of a wet etch and a chemical dry etch process.

18. The method as recited in claim 16, wherein the step of isotropically etching includes the step of expanding the holes such that lateral sidewalls of the oxide layer adjacent to the holes are recessed by a distance of at least about one third a minimum feature size for a given technology.

19. The method as recited in claim 16, wherein the holes are tapered.

20. The method as recited in claim 16, wherein the step of isotropically etching includes the step of forming a stepped portion in holes.

* * * * *